US008114178B2

(12) United States Patent
Izumi et al.

(10) Patent No.: US 8,114,178 B2
(45) Date of Patent: Feb. 14, 2012

(54) POLISHING COMPOSITION FOR SEMICONDUCTOR WAFER AND POLISHING METHOD

(75) Inventors: Masahiro Izumi, Tokyo (JP); Shinsuke Miyabe, Tokyo (JP); Kuniaki Maejima, Tokyo (JP); Hiroaki Tanaka, Kanagawa (JP)

(73) Assignees: Nippon Chemical Industrial Co., Ltd., Tokyo (JP); Speedfam Co., Ltd., Ayase-shi (JP)

( * ) Notice: Subject to any disclaimer, the term of this patent is extended or adjusted under 35 U.S.C. 154(b) by 678 days.

(21) Appl. No.: 12/081,829

(22) Filed: Apr. 22, 2008

(65) Prior Publication Data

US 2008/0311750 A1   Dec. 18, 2008

(30) Foreign Application Priority Data

Apr. 23, 2007   (JP) ................. 2007-112648

(51) Int. Cl.
*B24D 3/02* (2006.01)
*C09C 1/68* (2006.01)
*C09K 3/14* (2006.01)
(52) U.S. Cl. ............................................. 51/308; 106/3
(58) Field of Classification Search ......... 106/3; 51/308
See application file for complete search history.

(56) References Cited

U.S. PATENT DOCUMENTS

| | | | | |
|---|---|---|---|---|
| 5,230,833 A * | 7/1993 | Romberger et al. | ....... | 252/363.5 |
| 6,312,487 B1 * | 11/2001 | Tanaka | ............... | 51/309 |
| 6,334,880 B1 * | 1/2002 | Negrych et al. | ................. | 51/308 |
| 6,685,757 B2 * | 2/2004 | Xu et al. | ......................... | 51/308 |
| 7,497,966 B2 * | 3/2009 | Nam et al. | .................... | 252/79.1 |
| 2007/0175104 A1 * | 8/2007 | Nishiyama et al. | ............. | 51/307 |

FOREIGN PATENT DOCUMENTS

| | | |
|---|---|---|
| JP | 01-317115 | 12/1989 |
| JP | 02-146732 | 6/1990 |
| JP | 03-202269 | 9/1991 |
| JP | 04-187512 | 7/1992 |
| JP | 06-053313 | 2/1994 |
| JP | 09-193004 | 7/1997 |
| JP | 11-060232 * | 3/1999 |
| JP | 2001-048520 | 2/2001 |
| JP | 2002-105440 | 4/2002 |
| JP | 2003-089786 | 3/2003 |

* cited by examiner

*Primary Examiner* — Shuangyi Abu Ali

(74) *Attorney, Agent, or Firm* — Edwards Wildman Palmer LLP; James E. Armstrong, IV; Junko Harada

(57) ABSTRACT

The present invention relates to a polishing composition for a semiconductor wafer which is excellent in polishing property, and a polishing method. The polishing composition for a semiconductor wafer comprises colloidal silica consisting of non-spherical silica particles having a ratio of long axis to short axis of 1.5 to 15. The polishing method for a semiconductor wafer uses the polishing composition. The polishing composition can provide a remarkably high polishing rate compared with a polishing composition using spherical colloidal silica, and can provide good mirror-polishing without causing scratches. In addition, small alkali metal content enables reduction of adverse effects on a semiconductor wafer, such as residual abrasives after polishing.

10 Claims, 1 Drawing Sheet

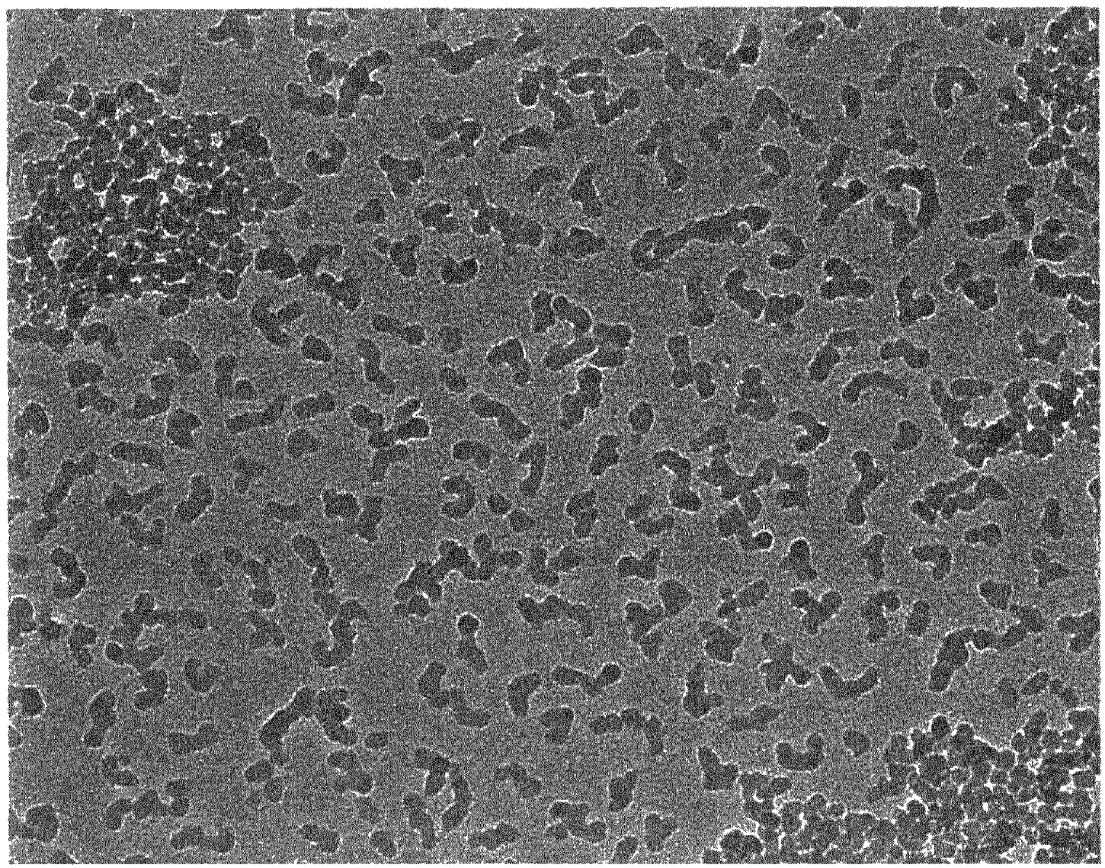

POLISHING COMPOSITION FOR SEMICONDUCTOR WAFER AND POLISHING METHOD

FIELD OF THE INVENTION

The present invention relates to a polishing composition for semiconductor wafers and a polishing method thereof. More specifically, the present invention relates to a polishing composition for semiconductor wafers used to polish the surface or edge of a semiconductor wafer, and a polishing method thereof. Furthermore, the present invention relates to a polishing method for allowing the surface and edge of a semiconductor wafer to have a mirror surface by using the polishing composition for semiconductor wafers. The semiconductor wafer that is subject to the polishing of the present invention includes preferably a silicon wafer and a semiconductor device substrate having a metal film, an oxide film, a nitride film, or others (hereinafter, called as metal film and others) formed on its surface.

BACKGROUND OF THE INVENTION

Many colloidal silicas consisting of non-spherical silica particles have been proposed. JP1-317115A discloses a stable silica sol containing amorphous colloidal silica particles dispersed in a liquid medium, the particles having an elongated shape elongated in only one plane and a uniform diameter along the elongation within the range of 5 to 40 mµ as measured by electron microscopic observation. JP 4-187512 A discloses a silica sol consisting of silica particles having an elongated shape, which are obtained by a method comprising adding a metal compound such as an aluminum salt, before, during, or after a step of adding a silicic acid solution. JP 11-60232 A discloses colloidal silica consisting of cocoon-shaped silica particles having a ratio of long axis to short axis of 1.4 to 2.2, which are obtained by hydrolyzing alkoxysilane. JP 2001-48520 A describes that colloidal silica containing non-spherical silica particles obtained by an active silicic acid aqueous solution of hydrolyzing alkoxysilane.

On the other hand, there are many proposal for polishing compositions for polishing the surface and edges of semiconductor wafers such as a silicon wafer or semiconductor device substrate having a metal film, an oxide film, a nitride film, etc. formed thereon.

The polishing composition containing the silica abrasive particles as a main ingredient is given as a solution that contains alkali components in general. The polishing mechanism can be described by the combination of chemical action by the alkali components, specifically chemical corrosion against the surface of silicon oxide film, metal films or the like, and mechanical abrasion by the silica abrasive particles. More specifically, the corrosion by the alkali components produces a thin and soft corrosion layer on the surface of an object product to be polished such as a wafer. It is estimated that the resulting corrosion layer is removed by the mechanical abrasion of the fine abrasive particles. It is considered that polishing may proceed by repeating these steps. After polishing, the silica abrasive particles and alkali components are removed from the surface and edge polished in a cleaning step. A problem that the abrasive particles remain on the wafer surface in the cleaning step has been pointed out. It is possible to largely improve such a state that the abrasive particles remain on the wafer surface by selecting properly polishing conditions or cleaning processes. On the other hand, polishing rate is largely lowered and the cleaning process becomes complicated. The problem has not yet been solved.

Polishing compositions comprising an alkali agent except sodium have been conventionally proposed for mirror-polishing a semiconductor wafer. For example, JP2-146732A discloses colloidal silica containing ethylenediamine. JP6-53313 discloses a method for polishing device wafers using an aqueous solution containing ethylenediamine pyrocatechol and silica fine powder. JP 9-193004 A discloses a polishing composition prepared by dispersing fumed silica having an average particle diameter of 5 to 30 nm in a KOH aqueous solution and a method of producing the polishing agent. JP 3-202269 A describes a polishing slurry of colloidal silica prepared by removing sodium through cation exchange. JP 3-202269 A proposes an addition of amine as a polishing promoter and quaternary ammonium salts as a bactericide. JP 2002-105440 A describes use of specific amine. JP2003-89786 discloses high-purity colloidal silica for polishing that is prepared using tetramethylammonium hydroxide in place of sodium hydroxide as an alkali agent used in the step of growing colloidal silica particles, and is substantially free of sodium.

A production process of the colloidal silica described in JP 1-317115A includes a step of adding a water soluble calcium salt, a water soluble magnesium salt, or a mixture thereof, which remains in the product of the colloidal silica as an impurity. A production process of the colloidal silica described in JP 4-187512 A includes a step of adding a water soluble aluminum salt, which remains in the product of the colloidal silica as an impurity. The colloidal silica described in JP 11-60232 A and JP 2001-48520 A preferably has high-purity, since the silica particles are prepared using an organic silicon compound as raw material. However, the colloidal silica has disadvantageous aspects such as removal of by-product alcohol, high cost, and the like.

When ethylenediamine is used in such cases as JP 2-146732 A and JP 6-53313 A above, the harmful properties of ethylenediamine are problematic. Although KOH is used in JP 9-193004 A, the corrosive power of KOH is extremely small compared with that of NaOH, and the use of KOH offers only a little improvement in corrosion. As described on page 7 of JP 3-202269 A, colloidal silica having low sodium content uses amine as a polishing promoter, and the small amount of quaternary ammonium salts added as a bactericide also has the effect of polish promotion. Examples describe use of aminoethyl ethanolamine and piperazine as amines. A Recent study has revealed that amines cause metal contamination on wafers, especially copper contamination on wafers, due to its metal chelate formation action. JP 3-202269 A describes that KOH is to be used for pH adjustment, and the reduction of sodium amount is a problem to be solved. JP 2002-105440 A describes the risk of wafer contamination caused by aminoethyl ethanolamine. The colloidal silica described in JP 2003-89786 A is an extremely preferable polishing agent because the colloidal silica does not have sodium in its aqueous phase, on its particle surfaces, or inside its particles. However, silica particles having a large of long axis to short axis ratio have not been obtained.

SUMMARY OF THE INVENTION

Therefore, it is an object of the present invention to provide a polishing composition for a semiconductor wafer comprising colloidal silica having little alkali metal content and consisting of non-spherical silica particles which can be made from no metal compounds without silicon. Another object of the present invention is to provide a polishing method for a semiconductor wafer by using the composition.

As a result of intensive study, the inventors of the present invention have solved the above problems.

That is, a first aspect of the present invention provides a polishing composition for a semiconductor wafer, comprising non-spherical colloidal silica having a ratio of long axis to short axis of 1.5 to 15 as measured by transmission electron microscopic observation. The composition preferably has an alkali metal content of 50 ppm or less based on the silica, and contains tetraethylammonium hydroxide. Tetraethylammonium hydroxide may hereinafter be described as TEAOH.

In addition, the colloidal silica preferably comprises silica particles having an average short axis of 5 to 30 nm as measured by transmission electron microscopic observation, and preferably has a silica concentration of 10 wt % to 50 wt %.

Further, the colloidal silica is made from tetraethylammonium hydroxide as one of the contained materials, and a suitable range of a mole ratio of silica to tetraethylammonium hydroxide is 10 to 120. The term "containing tetraethylammonium hydroxide" means containing tetraethylammonium ions because the component is dissolved in water. For example, a composition prepared by adding tetraethylammonium halides into an alkali solution with amine means "containing tetraethylammonium hydroxide".

A second aspect of the present invention provides a polishing composition for a semiconductor wafer, comprising a base and having pH of 8 to 11 at 25° C. The polishing composition preferably includes a buffer solution prepared by combining a weak acid where the logarithm of the reciprocal of the acid dissociation constant (pKa) at 25° C. is 8.0 to 12.5 and a strong base, and preferably has a buffering action between pH 8 and 11. Further, anions constituting the weak acid are preferably carbonate ions and/or hydrogen carbonate ions, and cations constituting the strong base are preferably choline ions, tetramethylammonium ions, tetraethylammonium ions or mixtures thereof, and, more preferably, tetramethylammonium ions, tetraethylammonium ions or mixtures thereof. Still further, conductivity per 1 wt % of silica particles at 25° C. is preferably 20 mS/m or more.

A third aspect of the present invention provides a polishing composition for a semiconductor wafer, comprising colloidal silica prepared by mixing colloidal silica consisting of a non-spherical silica particles and colloidal silica consisting of spherical silica particles, wherein concentration of the non-spherical silica particles is 0.5 wt % to 1.0 wt % with respect to the whole colloidal solution, and total concentration of the silica particles is 0.5 wt % to 50 wt % with respect to the whole colloidal solution.

A fourth aspect of the present invention provides a polishing method for=a semiconductor wafer, which comprises polishing a surface or edge of a semiconductor wafer by using the above polishing composition.

The polishing composition of the present invention using a non-spherical colloidal silica can allow a remarkably high polishing rate compared with polishing compositions using spherical colloidal silica, and can provide good mirror-polishing without causing scratches. In addition, the small content of alkali metal enables reduction of adverse effects to semiconductor wafers, such as abrasive particles remaining after polishing of the wafer.

BRIEF DESCRIPTION OF THE DRAWINGS

FIG. 1 is a TEM photograph of colloidal silica obtained in Production Example 1.

DETAILED DESCRIPTION OF THE PREFERRED EMBODIMENTS

The present invention will be further described below.

Colloidal silica consisting of non-spherical silica particles specifically means colloidal silica containing silica particles having such a shape as shown in FIG. 1 of Example 1. The silica particles have a ratio of long axis to short axis of 1.5 to 15. Though most of the silica particles are non-linearly elongated, some of the silica particles are not elongated. This is just an example, and although shapes of silica particles vary depending on production conditions, most of the silica particles have a non-spherical shape.

As colloidal silica containing silica particles having a ratio of long axis to short axis of less than 1.5 has low polishing performance, the objects of the present invention cannot be provided. As colloidal silica containing silica particles having a ratio of long axis to short axis of more than 15 has high polishing performance, but tends to produce flaws called scratches on the polishing surface, it is difficult to obtain flat surface accuracy. In addition, the colloidal silica easily undergoes change in its physical property such as second aggregation during use, so its polishing performance cannot be stabilized. From the viewpoint of further improving the polishing performance and stability of the polishing composition, the colloidal silica preferably has a ratio of long axis to short axis of 1.5 to 15. The non-spherical colloidal silica is preferably contained at 3 wt % or more with respect to total silica particles in a solution. In the present invention, silica particles other than the non-spherical colloidal silica can be contained. The non-spherical colloidal silica is particularly preferably used in combination with the spherical colloidal silica as mentioned above. Examples of other silica particles include polishing particles generally used for a semiconductor wafer, for example, the above fumed silica satisfying no specific value, and colloidal silica having a non-spherical shape such as a string shape, cocoon shape, or shallow spherical shape.

Colloidal silica used in the present invention, which consists of non-spherical silica particles having a ratio of long axis to short axis of 1.5 to 15 as measured by transmission electron microscopic observation, can be produced by the method described below.

Specifically, an active silicic acid aqueous solution is prepared by bringing a alkali silicate aqueous solution into contact with a cation exchange resin, and the active silicic acid aqueous solution is added with tetraethylammonium hydroxide to be adjusted to an alkaline. The resultant solution is heated to grow colloidal particles. Further, another active silicic acid aqueous solution and tetraethylammonium hydroxide are added to the resultant solution under heating while maintaining an alkalinity to promote particle growth. Subsequently, the solution is subjected to ultrafiltration to concentrate colloidal silica, whereby the desired colloidal silica is obtained.

Reduction of the amount of heavy metal and the like may also be provided during the production process. Specifically, an active silicic acid aqueous solution is prepared by bringing a alkali silicate aqueous solution into contact with a cation exchange resin. The active silicic acid aqueous solution is contacted with a chelate resin, and then a chelating agent or both a chelating agent and an oxidant are added to the active silicic acid aqueous solution. Next, tetraethylammonium hydroxide is added to the resultant solution to grow colloidal silica particles. Subsequently, the solution is subjected to ultrafiltration to remove chelated metal impurities while concentrating the colloidal silica, whereby the desired colloidal silica is obtained.

The above production method for colloidal silica is almost the same as a conventional production method using alkali metal hydroxide or alkali silicate as an alkali agent. Specifically, the same step of producing an active sol from sodium silicate is used in both production methods. The same step of growing particles is used except that tetraethylammonium hydroxide is used as an alkali agent in the above production method of colloidal silica. The same step of concentrating the colloidal silica to produce a product is taken in both production methods as well.

A solution with alkali component mainly containing silica particle is generally used as a composition for polishing semiconductor wafers, etc. The processing includes application of a chemical reaction of an alkali which is a component of the solution, specifically, it includes an application of the corrosion properties of the alkali to a work piece such as a silicon oxide film, a metal film, etc. That is, the corrosion properties of the alkali form a thin and soft corrosion layer on the surface of a work piece such as a wafer, etc. The processing progresses by removing the thin layer using a mechanical action of fine abrasive grains.

In the above processing, the shape of the silica particles contained in the colloidal silica and fumed silica is an important factor. That is, a thin layer is formed by corrosion by an alkali on the surface of a work piece, but the removal rate of the thin layer significantly varies depending on the shape of the silica particles. When particle diameter of the silica particles is larger, removal rate becomes higher, but more scratches tend to appear on the polished surface. Also, the removal rate of the thin layer is higher, but more scratches tend to appear on the polished surface when using a composition containing non-spherical particles in comparison to using a composition containing spherical particles. Therefore, the particles should have appropriate size and shape, but should not be easily broken or should not be highly aggregated to form a gel. In other words, silica particles effectively remove, by a mechanical action, a corrosion layer formed by an alkali. Therefore, the silica particles must not be those which have any effect on a new polished surface after the removal of the thin layer.

Silica particles contained in fumed silica generally have a ratio of long axis to short axis of 5 to 15, and form a long and slender particle group. The primary particle diameter (also described merely as particle diameter) of the fumed silica means the short axis (diameter) of the primary particle, is usually 7 to 40 nm, and does not reflect the length in a longitudinal direction. Further, the particles form second particles by aggregation, and the appearance of the slurry is white. Therefore, the polishing rate of fumed silica is high, but scratches are easily generated. In addition, after the slurry is left standing for a long time, the particles settle out, which is inconvenient. The silica particles according to the present invention have shapes similar to those of the primary particles of fumed silica, but do not form second particles by aggregation, and the appearance of the slurry is transparent or semitransparent. The polishing composition using non-spherical colloidal silica of the present invention can provide a remarkably high polishing rate compared with a composition using spherical colloidal silica, and can provide good mirror-polishing without generation of scratches.

In the polishing composition of the present invention, the total concentration of silica particles which contain non-spherical colloidal silica is preferably 0.5 to 50 wt % with respect to the whole solution. The concentration of the silica particles may be arbitrarily selected depending on whether a work piece to be polished is a metal or silicon oxide, so the concentration cannot be indiscriminately determined. For example, a copper alloy film can be polished at 0.5 to 2.0 wt % of silica concentration. On the other hand, 2 to 25 wt % of silica concentration is preferable for polishing edges with a view to further improving polishing performance of the polishing composition. It is generally preferred to produce slurry having more than 30 wt % of silica concentration and appropriately dilute the slurry when used. In the steps of circulating the slurry to polish a plurality of wafers, the slurry can be easily diluted by mixing in pure water, so slurry with a high silica concentration can be prepared and added to the diluted slurry so as to provide recovery of the diluted slurry concentration.

Alkali metal content may be 50 ppm or less based on silica. It is necessary to keep the alkali metal content in the above range in order to solve the problem of residual polishing abrasives on the wafer surface. The alkali metal content is more preferably kept at 30 ppm or less.

Colloidal silica contains tetraethylammonium hydroxide, and an appropriate range of a mole ratio of silica to tetraethylammonium hydroxide is 10 to 120. Colloidal silica containing tetraethylammonium hydroxide used during the colloidal particle growth step is preferable. Tetraethylammonium hydroxide has an important action in addition to a role as an alkali agent. That is, tetraethylammonium hydroxide acts to prevent the polishing abrasive grains from remaining on the surface of the wafer. Therefore, the presence of tetraethylammonium hydroxide in the above range is preferable.

The colloidal silica used in the present invention has an average short axis of silica particles by electron microscopic observation of 5 to 30 nm, has a silica concentration of 10 to 50 wt % and can be produced by the above production method. When the average short axis of silica particles is less than 5 nm, polishing rate becomes low, which easily causes particle aggregation and colloid instability. In addition, when the average short axis of silica particles is more than 30 nm, scratches are easily generated, and the flatness of the polished surface is reduced.

Further, the polishing composition also preferably contains a base (alkali agent), and has pH of 8 to 11 at 25° C. Moreover, the pH of the whole solution is preferably kept in the range of 8 to 11 in the present invention in order that stable polishing performance is maintained during actual polishing processing. When the pH is less than 8, polishing rate becomes low, and the polishing composition may be out of the range of practical use. On the other hand, when the pH is more than 11, etching at portions other than the polished portion becomes too strong, and silica particles start aggregating. Therefore, stability of the polishing composition diminishes, and the polishing composition may also be out of the range of practical use. In addition, it is preferred that the pH does not easily change from conceivable external conditions such as friction, heat, contact with the atmosphere, and mixture with other components. The polishing composition is used as a circulating flow, particularly in edge polishing. That is, the polishing composition provided from a slurry tank to a polishing site is used via a method of being returned to the slurry tank. When a polishing composition of the related art only containing an alkali agent is used, the pH becomes low in a short time during use of the composition. This is because the polished products are dissolved or cleaning water is mixed in the solution. Keeping the pH of the polishing composition in a slurry tank constant is a very complicated task, and improperly polished products can be produced easily.

Therefore, the polishing composition itself in the present invention is preferably a solution having what is called a strong buffering action, in which the range of pH change is small with respect to changes in external conditions. The buffer solution may be prepared by using a weak acid having a pKa (logarithm of the reciprocal of acid dissociation constant (Ka)) at 25° C. of 8.0 to 12.5 in combination with a strong base. When the pKa at 25° C. is less than 8.0, a large amount of both the weak acid and the strong base must be added in order to raise the pH value, so a pKa of less than 8.0 is not preferable. When the pKa at 25° C. is more than 12.5, a buffer solution having a sufficient buffering action to stabilize the pH in the range of 8 to 11 cannot be easily prepared, so a pKa of more than 12.5 is not preferable.

In the present invention, examples of weak acids used for preparing a polishing composition solution having a buffering action include: inorganic acids such as carbonic acid (pKa=6.35, 10.33), boric acid (pKa=9.24), and phosphoric acid (pKa=2.15, 7.20, 12.35); water soluble organic acids; and mixtures thereof. Examples of the water soluble organic acids include: phenols such as phenol (pKa=10.0), catechol (kPa=9.25, 12.37), and hydroquinone (pKa=9.91, 11.56); amines such as ethylenediamine (pKa=7.52<10.65) and 2-aminoethanol (pKa=9.5); amino acids such as glycine (pKa=2.35, 9.78) and 4-aminobutyric acid (pKa=4.03, 10.56); and heterocyclic compounds such as pyrrolidine (pKa=11.3) and piperidine (pKa=11.12). Note that carbonic acid includes a form of hydrocarbon ions. Cations constituting a strong base are preferably at least one of choline ions, tetramethylammonium ions, and quaternary ammonium ions, more preferably tetramethylammonium ions, tetraethylammonium ions or mixtures thereof.

As quaternary ammonium ions other than choline ions and tetramethylammonium ions, tetraethylammonium ions, benzyltrimethylammonium ions, tetrapropylammonium ions, tetrabutylammonium ions, phenyltrimethylammonium ions, methyltrihydroxyethylammonium ions, etc. are preferably available.

The buffer solution described in the present invention means a state in which a weak acid is dissociated as an ion having a different valence in a solution formed of the above-mentioned combination, or a solution formed of the above-mentioned combination in which a dissociation state and non-dissociation state coexist, and is characterized in that contamination of a small amount of acids or a small amount of bases leads to the little change in pH.

In the present invention, a polishing processing rate can be remarkably improved by increasing conductivity of the polishing composition solution. Conductivity is a value showing how easily electricity passes in a solution, and is a reverse value of electric resistance value per unit length. Conductivity value (micro Siemens) per unit length is shown by converting it to a value per 1 wt % of silica in the present invention. In the present invention, conductivity of 20 mS/m/1%-$SiO_2$ or higher at 25° C. is preferable for improving the polishing processing rate, and conductivity of 25 mS/m/1%-$SiO_2$ or higher at 25° C. is more preferable. There are two methods to increase conductivity as shown below. One is a method of increasing concentration of a buffer solution, and the other is a method of adding salts. In order to increase the concentration of the buffer solution, only the concentration may be increased with no change in the mole ratio of acid to base. The salts used for the method of adding the salts consist of a combination of an acid and a base. One of a strong acid and a weak acid may be used as an acid, and mineral acids, organic acids, and mixtures thereof may be used. One of a strong base and a weak base may be used as a base, and alkali metal hydroxide, hydroxide of water soluble quaternary ammonium ions, water soluble amine, ammonium, or mixtures thereof may be used as a base. Quaternary ammonium ions are preferable in the present invention. In the case of addition in combination of a weak acid and a strong base, a strong acid and a weak base, or a weak acid and a weak base, addition in a large amount is not desirable, because the pH in the buffer solution may be changed. The above two methods may also be used in combination.

When the composition for polishing a semiconductor wafer according to the present invention is a colloidal solution in which silica particles forming a non-spherical particle group and having a ratio of long axis to short axis of 1.5 to 15 as measured by transmission electron microscopic observation have a concentration of 0.5 to 10 wt %, and the concentration of whole silica particles is 0.5 to 50 wt %, the composition for polishing a semiconductor wafer may contain other silica particles. Examples of other silica particles include polishing particles generally used for polishing semiconductor wafers such as spherical colloidal silica which does not satisfy the above specific values and fumed silica. Of those, spherical colloidal silica is particularly preferable.

Specifically colloidal silica or fumed silica may be compounded at 1 to 10 wt % in 1 wt % of non-spherical silica particle having a ratio of long axis to short axis of 1.5 to 15. Silica weight of the spherical colloidal silica is preferably 2 to 8 wt %.

In addition, the presence of polishing abrasives other than silica is also preferable. Ceria, aluminum oxide, zirconia, organic abrasives, silica organic complex abrasives, and the like are preferable as polishing abrasives other than silica. Abrasives of ceria, aluminum oxide, and zirconia preferably have a particle diameter of 20 to 100 nm.

In addition, the polishing composition of the present invention preferably contains a chelating agent. Any chelating agent may be used in the present invention as long as the chelating agent binds to the composition as a metal multidentate ligand, and does not impair the effects of the present invention. The chelating agent is preferably selected from (1) ethylenediaminetetraacetic acid and its salts, (2) hydroxyethylethylenediaminetriacetic acid and its salts, (3) dihydroxyethylethylenediaminediacetic acid and its salts, (4) diethylenetriaminepentaacetic acid and its salts, (5) triethylenetetraminehexaacetic acid and its salts, (6) hydroxyethyliminodiacetic acid and its salts, and (7) gluconic acid and its salts. Specific examples of the foregoing include (1) disodium ethylenediaminetetraacetate, trisodium ethylenediamine tetraacetate, tetrasodium ethylenediamine tetraacetate, diammonium ethylenediamine tetraacetate, triammonium ethylenediamine tetraacetate, and tetraammonium ethylenediamine tetraacetate, (2) trisodium hydroxyethylethylenediamine triacetate, and triammonium hydroxyethylethylenediamine triacetate, (3) disodium dihydroxyethylethylenediamine diacetate, and diammonium dihydroxyethylethylenediamine diacetate, (4) diethylenetriaminepentaacetate, pentasodium diethylenetriaminepentaacetate, pentaammonium diethylenetriaminepentaacetate, disodium iron diethylenetriaminepentaacetate, and diammonium iron diethylenetriaminepentaacetate, (5) hexasodium triethylenetetramine hexaacetate and hexaammonium triethylenetetramine hexaacetate, (6) disodium hydroxyethylimino diacetate and diammonium hydroxyethylimino diacetate, (7) sodium gluconate, potassium gluconate, calcium gluconate, and trisodium gluconate-6-phosphate. Further, nitrilotriacetic acid salts, glycine, and salicylic acid are also suitable. Of those chelating agents, an "acid" type not containing an alkali metal and an "ammonium salt" type may be preferably used.

Those chelating agents may contain crystal water or may be anhydride. Two or more kinds of those chelating agents may be used in combination, in which those chelating agents may be used in combination in any proportion. A method in which the above-mentioned oxidant is added in synchronization with addition of the chelating agent can also be adopted to contribute to removal of Cr or the like.

Moreover, the polishing composition of the present invention preferably contains a chelating agent that forms a water insoluble chelate compound with copper. For example, the chelating agents preferably include known compounds like azoles such as benzotriazole and quinolinic derivatives such as quinolinol and quinaldic acid.

The content of a chelating agent in the polishing composition of the present invention varies depending on the effect of the chelating agent used. The content is preferably 0.01 to 1 wt %, and more preferably 0.05 to 0.5 wt % with respect to the total amount of the polishing composition. Increased addition of the chelating agents generally tends to bring a stronger expression of the effects of the present invention. However, when the chelating agents are added excessively, the effects of the invention diminish, whereby economic disadvantage may be brought about, so careful consideration should be taken on the amount of the chelating agents.

In addition, the polishing composition of the present invention preferably contains a surfactant. An anion surfactant, a cation surfactant, a nonionic surfactant, an ampholytic surfactant, a polymer surfactant, or the like can be used as a surfactant. The polishing composition preferably contains a nonionic surfactant. The nonionic surfactant has an effect of preventing excessive etching. Examples of the nonionic surfactant that can be used include polyoxyalkylene alkyl ethers such as polyoxyethylene laurylether, fatty acid esters such as glycerin ester, and polyoxyalkylene alkyl amines such as di(polyoxyethylene)lauryl amine. Polyoxyalkylene alkyl ether is particularly preferable. The suitable concentration of the surfactant contained in the polishing composition is about 1 to 1,000 ppm.

A surfactant, especially an anion-based surfactant, tends to cause a negative action called bubbling phenomenon if the surfactant is not properly used. A defoamer is usually used simultaneously to inhibit the bubbling phenomenon, and a silicone defoamer is extremely effective. The silicone defoamer includes oil types, modified oil types, solution types, powder types, and emulsion types. The modified oil type and the emulsion type can be used because of their good dispersion properties in a colloidal solution. Of those, the emulsion type is the most effective, and has good sustainability. For example, Shin-Etsu Silicone KM Grade manufactured by Shin-Etsu Chemical Co., Ltd. is commercially available. The amount of the defoamer to be used must be appropriately determined depending on the amount of the surfactant, and an appropriate amount of the defoamer is about 1 to 1,000 ppm as a defoaming active component in the polishing composition.

Moreover, the effects of the polishing composition of the present invention can be enhanced by adding a water soluble polymer. As described above, a water soluble polymer having a molecular weight of 5,000 or more and a water soluble polymer having a molecular weight of 100,000 or more are said to contribute to reduction of metal contamination and improvement of the flatness of a wafer. However, when a polymer having as large a molecular weight as the above is used, the polymer has a drawback that only a small amount of the polymer can be compounded in order to prevent the viscosity of the polishing composition from becoming too high. An appropriate amount of the water soluble polymer is about 100 to 10,000 ppm in the polishing composition, the water soluble polymer having an average molecular weight of 5,000 or less, and preferably 500 or more to 3,000 or less.

Any of the following polymers can be used as the above water soluble polymers: polyacrylate, polymethacrylate, polyvinylpyrrolidone, polyvinylalcohol, polyethyleneglycol, a maleic acid/vinyl copolymer, xanthan gum, and cellulose derivatives. One or more of the polymers selected from cellulose derivatives, polyvinylalcohol, and polyethyleneglycol are preferable. As cellulose derivatives, hydroxymethyl cellulose, hydroxyethyl cellulose, hydroxypropyl cellulose, carboxymethyl cellulose, and the like can be used, and hydroxyethyl cellulose is preferable. Polyethylene glycol having a molecular weight of 5,000 or less is more preferable.

Further, an oxidant can be arbitrarily compounded in the present invention. As the oxidant, a hydrogen peroxide solution, persulfate, perborate, or the like is preferable.

In order to improve the physical property of the polishing composition of the present invention, a bactericide, a fungicide, a pH indicator, a wetter, a water-miscible organic solvent, an antifreezing agent, an anticorrosion agent, a polishing end point detecting agent, a colorant, an antisettling agent, and the like can be used in combination. As a dispersant and an antisettling agent, a water soluble organic substance, an inorganic layer-shaped compound, and the like are included. The polishing composition of the present invention is preferably in the state of an aqueous solution, but an organic solvent may be added to the solution. In particular, ethylene glycol and glycerin are preferable as an antifreeze agent and a wetter. Isopropyl alcohol and the like greatly contribute to lowering surface tension. The polishing composition of the present invention may be prepared by mixing other polishing agents such as colloidal silica, a base, additive, water, and the like during polishing.

EXAMPLE

The present invention will be described in more detail in the examples as follows. Hereinafter, tetraethylammonium hydroxide and tetramethylammonium hydroxide may be described as TEAOH and TMAOH, respectively.

The following apparatuses were used for measurement in the examples.

TEM observation: Hitachi, Ltd., transmission electron microscope, Type H-7500

BET method specific surface area: Shimadzu Corporation, FlowSorb Type 2300

Analysis of tetraethylammonium hydroxide: Shimadzu Corporation, Total Organic Carbon Analyzer TOC-5000A, SSM-5000A, Carbon amount is converted to the amount of tetraethylammonium hydroxide.

Metal element analysis: HORIBA, Ltd., ICP atomic emission spectroscopy, ULTIMA2

Conductivity: DKK-TOA Corporation, Conductivity meter Type CM-40S

The following chemicals were used in the examples.

Tetraethylammonium hydroxide: Commercially available 20 wt % TEAOH solution (manufactured by SACHEM INC.)

Tetramethylammonium hydroxide: Commercially available 25 wt % TMAOH solution.

Tetramethylammonium hydrogen carbonate: Prepared by blowing a carbon dioxide gas into the above 25 wt % TMAOH solution to neutralize to pH 8.4. The concentration of tetramethylammonium hydrogen carbonate analyzed by chemical analysis was 33 wt %. Hereinafter, tetramethylammonium hydrogen carbonate may be described as $TMAHCO_3$.

Tetramethylammonium carbonate: Prepared by mixing tetramethylammonium hydroxide and tetramethylammonium hydrogen carbonate at a predetermined mole ratio described in the examples. Hereinafter, tetramethylammonium carbonate may be described as $(TMA)_2CO_3$.

Production Example 1

A dilute sodium silicate having a silica concentrated of 4.5 wt % was prepared by adding 520 g of JIS No. 3 sodium silicate ($SiO_2$: 28.8 wt %, $Na_2O$: 9.7 wt %, $H_2O$: 61.5 wt %) to 2,810 g of deionized water and uniformly mixing them.

The dilute sodium silicate was dealkalized by passing it through a 1,200-ml column of a H-type strong acid cation exchange resin (AMBERLITE IR120B manufactured by ORGANO Corp.) that was preliminary regenerated with hydrochloric acid. In this way, 4,040 g of an active silicic acid having a pH of 2.9 and a silica concentration of 3.7 wt % were obtained.

After that, colloid particles were grown by the build-up process. To the part (500 g) of the active silicic acid thus obtained, a 20 wt % tetraethylammonium hydroxide aqueous solution was added with stirring to adjust the pH at 8.7, and then the mixture was kept at 95° C. for 1 hour to prepare seed sol. To the resultant seed sol, the remaining active silicic acid, 3,540 g, were added over 6 hours. During the addition, the pH was kept at 10 by adding a 20 wt % tetraethylammonium hydroxide aqueous solution. The temperature was also kept at 95° C.

After the addition, the resulting reaction product was aged at 95° C. for 1 hour, and left to cool. The reaction product was filtered off under pressure using a hollow fiber ultrafiltration membrane having a fractionation molecular weight of 6,000 (MICROZA UF Module SIP-1013 manufactured by ASAHI KASEI Corp.) while the reaction product was circulated with a liquid circulation pump. In this way, the reaction product was concentrated to 38 wt % of silica concentration to obtain about 390 g of colloidal silica.

The silica particle diameter of the colloidal silica was 10.9 nm by BET method. FIG. 1 shows the TEM image of the colloidal silica. The silica particles shown in FIG. 1 are a non-spherical particles. The short axis of the colloidal silica particles was about 15 nm and a ratio of the long axis/the short axis was 1.5 to 15 from the TEM image. The colloidal silica contained 1.57 wt % of tetraethylammonium hydroxide, and the mole ratio of silica to tetraethylammonium hydroxide was 59. And the Na contents based on silica was 15 ppm. Use of tetraethylammonium hydroxide resulted in obtainment of colloidal silica containing a small amount of metal ions.

Production Example 2

A dilute sodium silicate having a silica concentrated of 4.5 wt % was prepared by adding 520 g of JIS No. 3 sodium silicate ($SiO_2$: 28.8 wt %, $Na_2O$: 9.7 wt %, $H_2O$: 61.5 wt %) to 2,810 g of deionized water and uniformly mixing them.

The dilute sodium silicate was dealkalized by passing it through a 1,200-ml column of a H-type strong acid cation exchange resin (AMBERLITE IR120B manufactured by ORGANO Corp.) that was preliminary regenerated with hydrochloric acid. In this way, 4,040 g of an active silicic acid having a pH of 2.9 and a silica concentration of 3.7 wt % were obtained.

The active silicic acid had a content of Na of 80 ppm based on the silica. The active silicic acid had respective contents of Cu, Zn, Cr, Ca, Mg and Fe of 360 ppb, 2,600 ppb, 1,800 ppb, 11,100 ppb, 18,000 ppb and 28,200 ppb based on the silica. Next, active silicic acid was passed through a 100 ml column of a H-type chelate resin (AMBERLITE IRC748 manufactured by ORGANO Corp.) that was preliminary regenerated with hydrochloric acid. In this way, 4,950 g of an active silicic acid having a pH of 3.2 and a silica concentration of 3.0 wt % were obtained.

The active silicic acid had respective contents of Cu, Zn, Cr, Ca, Mg and Fe of 90 ppb, 780 ppb, 600 ppb, 6,900 ppb, 9,800 ppb and 12,600 ppb based on the silica. It was confirmed that the chelate resin contributed to reduction of metal ions.

After that, colloid particles were grown by the build-up process. To the part (410g) of the active silicic acid thus obtained, a 20 wt % tetraethylammonium hydroxide aqueous solution was added with stirring to adjust the pH at 8.7, and then the mixture was kept at 95° C. for 1 hour to prepare seed sol. To the resultant seed sol, the remaining active silicic acid 4,540 g, were added over 6 hours. During the addition, the pH was kept at 10 by adding a 20 wt % tetraethylammonium hydroxide aqueous solution. The temperature was also kept at 95° C.

After the addition, the resulting reaction product was aged at 95° C. for 1 hour, and left to cool. The reaction product was filtered off under pressure using a hollow fiber ultrafiltration membrane having a fractionation molecular weight of 6,000 (MICROZA UF Module SIP-1013 manufactured by ASAHI KASEI Corp.) while the reaction product was circulated with a liquid circulation pump. In this way, the reaction product was concentrated to 38 wt % of silica concentration to obtain about 390 g of colloidal silica. The silica particle diameter of the colloidal silica was 15.0 nm by BET method. The silica particles are a non-spherical particles. And a ratio of the long axis/the short axis was 1.5 to 8 from the TEM image.

Subsequently, 240 g of pure water was added to the obtained colloidal silica, followed by stirring. The resultant solution was subjected to the same ultrafiltration as described above, to thereby concentrate silica to a concentration of 38 wt %. As a result, tetraethylammonium hydroxide and metal components were washed away. The colloidal silica contained 0.83 wt % of tetraethylammonium hydroxide, and the mole ratio of silica to tetraethylammonium hydroxide was 112. The colloidal silica had a content of Na of 5 ppm, and respective contents of Cu, Zn, Cr, Ca, Mg and Fe were 50 ppb, 400 ppb, 400 ppb, 3,500 ppb, 5,000 ppb and 8,000 ppb, based on the silica. Contact with the chelate resin and use of tetraethylammonium hydroxide resulted in obtainment of colloidal silica containing a small amount of metal ions.

Production Example 3

To 8,535 g of deionized water, 785 g of ethylenediaminetetraacetate and 680 g of a 28 wt % ammonia solution was added and dissolved to prepare an EDTA-ammonia solution.

A dilute sodium silicate having a silica concentrated of 4.5 wt % was prepared by adding 40 kg of JIS No. 3 sodium silicate ($SiO_2$: 28.8 wt %, $Na_2O$: 9.7 wt %, $H_2O$: 61.5 wt %) to 216 kg of deionized water and uniformly mixing them.

The dilute sodium silicate was dealkalized by passing it through a 120 L column of a H-type strong acid cation exchange resin (AMBERLITE IR120B manufactured by ORGANO Corp.) that was preliminary regenerated with hydrochloric acid. In this way, 300 kg of an active silicic acid having a pH of 2.9 and a silica concentration of 3.8 wt % were obtained.

The active silicic acid had a content of Na of 60 ppm based on the silica. The active silicic acid had respective contents of Cu, Zn, Cr, Ca, Mg and Fe of 360 ppb, 2,600 ppb, 1,800 ppb, 11,100 ppb, 18,000 ppb and 28,200 ppb based on the silica. Next, the active silicic acid was passed through a 12 L column of Type H chelate resin (AMBERLITE IRC748 manufactured by ORGANO Corp.) that was preliminary regenerated with hydrochloric acid. In this way, 320 kg of an active silicic acid having a pH of 3.0 and a silica concentration of 3.5 wt % were obtained.

The active silicic acid had respective contents of Cu, Zn, Cr, Ca, Mg and Fe of 90 ppb, 780 ppb, 600 ppb, 6,900 ppb, 9,800 ppb and 12,600 ppb based on the silica. It was confirmed that the chelate resin contributed to reduction of metal ions.

Subsequently, to the active silicic acid, 770 g of the EDTA-ammonia solution was added as a chelating agent, and were mixed uniformly. The added amount of the EDTA-ammonium solution was 18 mg-equivalent to 1 kg of silica.

After that, colloid particles were grown by the build-up process. To the part (8 kg) of the active silicic acid thus obtained, 22 kg of deionized water and a 20 wt % tetraethylammonium hydroxide aqueous solution was added with stirring to adjust the pH at 9.0, and then the mixture was kept at 98° C. for 1 hour to prepare seed sol. To the resultant seed sol, the remaining active silicic acid 312 kg were added over 12 hours. During the addition, the pH was kept at 10 by adding a 20 wt % tetraethylammonium hydroxide aqueous solution. The temperature was also kept at 98° C. The ammonium component was removed by evaporation during the above heating process.

After the addition, the resulting reaction product was aged at 98° C. for 1 hour, and left to cool to 50° C. The reaction product was filtered off under pressure using a hollow fiber ultrafiltration membrane having a fractionation molecular weight of 10,000 (MICROZA UF Module SIP-3053 manufactured by ASAHI KASEI Corp.) while the reaction product was circulated with a liquid circulation pump. In this way, the reaction product was concentrated to 40 wt % of silica concentration to obtain about 28 kg of colloidal silica. The ultrafiltration concentration process contributed to removal of about 95 wt % of the total amount of EDTA.

The silica particle diameter of the colloidal silica was 19 nm, and the silica particles are a non-spherical particles. And a ratio of the long axis/the short axis was 1.5 to 6 from the TEM image. The content of Na was 8 ppm, and respective contents of Cu, Zn, Cr, Ca, Mg and Fe was 40 ppb, 450 ppb, 300 ppb, 1,000 ppb, 800 ppb and 8,000 ppb, based on the silica. Combined use of a chelate resin and a chelating agent together with use of tetraethylammonium hydroxide resulted in obtainment of colloidal silica containing a small amount of metal ions.

Example 1 and Comparative Example 1

A silicone wafer polishing test was performed by using the colloidal silica (Example 1) prepared in Production Example 1 (a particle diameter of 10.5 nm by a BET method, a silica concentration of 38 wt %, and a small amount of metal ions), and commercially available colloidal silica ("Silicadol 40L" manufactured by Nippon Chemical Industrial Co., Ltd., particle diameter of 21 nm, silica concentration of 40 wt %, Na content of 4,000 ppm) as a comparative example. The colloidal silica was diluted with pure water to obtain the silica concentration of 5.0 wt %.

To both of the diluted colloidal silicas, 20 wt % tetramethylammonium hydroxide aqueous solution (TMAOH) was added with stirring to adjust the pH at 10.5, to prepare each of the polishing compositions. A 6 inch silicon wafer (bare wafer) was selected as a work piece, and surface polishing was performed under the following conditions, followed by cleaning. Adhered stains after drying were determined, and polishing rates were measured. Adhered stains were determined by visual observation on both surfaces of a wafer during irradiation by a focused lamp. The polishing rate was estimated from the weight difference of the device wafer before and after polishing.

In order to check for adhered stains, 20 pieces of each wafer for polishing processing were produced. As a result, no wafer with adhered stains was found in Example 1, and 20 pieces of wafers with only a few stains adhered were found in Comparative Example 1.

Whereas the average polishing rate for performing polishing on 20 wafers was 0.31 μm/minute in Example 1, the average polishing rate was 0.26 μm/minute in Comparative Example 1.

(Processing Conditions)
Polishing machine: type SH-24 manufactured by SPEEDFAM Co., Ltd.
Plate rotating speed: 60 rpm
Load: 200 g/cm$^2$
Method of holding wafer: reduced pressure suction
Carrier chuck vacuum: 50 mmHg
Wafer carrier rotating speed: 120 rpm
Polishing pad: "SUBA600" (manufactured by NITTA HAAS Inc.),
Polishing composition flow rate: 60 ml/minute
Polishing duration: 5 minutes
Work piece: 6 inch silicon wafer
Cleaning after polishing: cleaning for 30 seconds with 1 wt % ammonia water, followed by cleaning for 30 seconds with pure water Example 2 and Comparative Example 2

A silicone wafer edge polishing test was performed by using the colloidal silica (Example 1) prepared in Production Example 1 (a particle diameter of 10.5 nm by a BET method, a silica concentration of 38 wt %, and a small amount of metal ions), and commercially available colloidal silica ("Silicadol 40L" manufactured by Nippon Chemical Industrial Co., Ltd., particle diameter of 21 nm, silica concentration of 40 wt %, Na content of 4,000 ppm) as a comparative example. The colloidal silica was diluted with pure water to obtain the silica concentration of 5.0 wt %. To each of the diluted colloidal silica, 25 wt % tetramethylammonium hydroxide aqueous solution (TMAOH) was added with stirring to adjust the pH at 10.5, to prepare each of the polishing compositions. An 8 inch (200 mm) silicon wafer (bare wafer) was selected as a work piece, and edge polishing was performed under the following conditions, followed by cleaning. Adhered stains after drying were determined, and polishing rates were measured. Adhered stains were determined by visual observation on an absorption surface of a wafer during irradiation by a focused lamp. The polishing rate was estimated from the weight difference of the device wafer before and after polishing.

In order to check for adhered stains, 10 pieces of each wafer for polishing processing were produced. As a result, no wafer with adhered stains was found in Example 2, and 10 pieces of wafers with only a few stains adhered were found in Comparative Example 2.

Whereas the average polishing rate for performing polishing on 10 wafers was 7.1 μm/minute in Example 2, the average polishing rate was 2.3 μm/minute in Comparative Example 2.

(Polishing Conditions)
Polishing machine: type EPD-200X manufactured by SPEEDFAM Co., Ltd.
Wafer rotation number: 2,000 rpm
Polishing time: 60 seconds/piece
Polishing composition supply amount: 3 L/minute
Polishing cloth: "SUBA400" (manufactured by NITTA HAAS Inc.)
Load: 40 N/unit
Work piece: 8 inch silicon wafer Cleaning after polishing: cleaning for 30 seconds with 1 wt % ammonium water, followed by cleaning for 30 seconds with pure water Examples 3 to 15

A pH buffer aqueous solution consisting of tetramethylammonium hydrogen carbonate ($TMAHCO_3$) and tetramethylammonium hydroxide (TMAOH) was added to each of the colloidal silicas prepared in Production Examples 1, 2, and 3, and each of the resultant mixtures was subjected to a polishing test.

The mole ratio of TMAOH to $TMAHCO_3$ in the pH buffer aqueous solution consisting of $TMAHCO_3$ and TMAOH was set to TMAOH (mole)/$CO_3$ (mole)=1.6, and an addition amount was represented as a mole number of tetramethylammonium carbonate [$(TMA)_2CO_3$] per 1 kg of silica. FIG. 1 shows each level of the tests performed. Polishing conditions were the same as those in Example 2.

Comparative Examples 3 to 8

A pH buffer aqueous solution consisting of $TMAHCO_3$ and TMAOH was added to commercially available colloidal silica ("Silicadol 40L" manufactured by Nippon Chemical Industrial Co., Ltd., particle diameter of 21 nm, silica concentration of 40 wt %, Na content of 4,000 ppm), and the resultant mixture was subjected to a polishing test as Comparative Example 3. The mole ratio of TMAOH to $TMAHCO_3$ in the pH buffer aqueous solution consisting of $TMAHCO_3$ and TMAOH was set to TMAOH (mole)/$CO_3$ (mole)=1.6, and an addition amount was represented as a mole number of $(TMA)_2CO_3$ per 1 kg of silica. FIG. 2 shows each level of the tests performed. Polishing conditions were the same as those in Example 2.

TABLE 1

Edge polishing test results

| Item | Example 3 | Example 4 | Example 5 | Example 6 | Example 7 | Example 8 | Example 9 |
|---|---|---|---|---|---|---|---|
| Kind of slurry | Production Example 1 | Production Example 1 | Production Example 1 | Production Example 1 | Production Example 1 | Production Example 1 | Production Example 2 |
| Silica concentration (wt %) | 2.0 | 2.0 | 4.0 | 4.0 | 6.0 | 6.0 | 2.0 |
| $(TMA)_2CO_3$ (mol/kg-$SiO_2$) | 0.044 | 0.088 | 0.044 | 0.088 | 0.02 | 0.088 | 0.02 |
| pH. | 10.1 | 10.4 | 10.3 | 10.3 | 10.3 | 10.4 | 10.4 |
| Conductivity (per 1 wt % of silica particle) | 14.9 | 22.3 | 14.2 | 20.9 | 12.5 | 20.2 | 11.9 |
| Polishing test results | | | | | | | |
| Polishing rate (μm/min) | 6.3 | 6.8 | 7.4 | 8.5 | 8.7 | 9.9 | 5.6 |
| State of stain appearance on absorption surface | none | none | none | none | none | none | none |

| Item | Example 10 | Example 11 | Example 12 | Example 13 | Example 14 | Example 15 |
|---|---|---|---|---|---|---|
| Kind of slurry | Production Example 2 | Production Example 2 | Production Example 2 | Production Example 2 | Production Example 3 | Production Example 3 |
| Silica concentration (wt %) | 2.0 | 2.0 | 5.0 | 5.0 | 2.0 | 5.0 |
| $(TMA)_2CO_3$ (mol/kg-$SiO_2$) | 0.044 | 0.088 | 0.02 | 0.08 | 0.02 | 0.08 |
| pH. | 10.3 | 10.3 | 10.3 | 10.3 | 10.3 | 10.3 |
| Conductivity (per 1 wt % of silica particle) | 14.1 | 21.0 | 14.3 | 20.1 | 15.0 | 20.6 |
| Polishing test results | | | | | | |
| Polishing rate (μm/min) | 6.8 | 7.4 | 8.1 | 9.1 | 6 | 9.3 |
| State of stain appearance on absorption surface | none | none | none | none | none | none |

TABLE 2

Edge polishing test results

| Item | Comparative Example 3 | Comparative Example 4 | Comparative Example 5 | Comparative Example 6 | Comparative Example 7 | Comparative Example 8 |
|---|---|---|---|---|---|---|
| Kind of slurry | 40 L(*1) | 40 L(*1) | 40 L(*1) | 40 L(*1) | 40 L(*1) | 40 L(*1) |
| Silica concentration (wt %) | 2.0 | 2.0 | 4.0 | 4.0 | 6.0 | 6.0 |
| $(TMA)_2CO_3$ (mol/kg-$SiO_2$) | 0.044 | 0.088 | 0.044 | 0.088 | 0.02 | 0.088 |
| pH. | 10.1 | 10.2 | 10.2 | 10.2 | 10.2 | 10.3 |
| Conductivity (per 1 wt % of silica particle) | 15.2 | 22.8 | 14.6 | 21 | 13 | 20.4 |
| Polishing test results | | | | | | |
| Polishing rate (μm/min) | 1.7 | 2.1 | 3.9 | 4.6 | 5.8 | 6.8 |
| State of stain appearance on absorption surface | None | None | Haze found | Haze found | Haze found | Haze found |

(*1)Silicadol 40 L

Examples 16 to 20

After the colloidal silica prepared in Production Example 1 and the colloidal silica consisting of spherical silica particles prepared in Production Example 4 described below were mixed, a pH buffer aqueous solution consisting of $TMAHCO_3$ and TMAOH was added to the mixture, and the resultant mixture was subjected to a polishing test.

The mole ratio of TMAOH to $TMAHCO_3$ in the pH buffer aqueous solution consisting of $TMAHCO_3$ and TMAOH was set to TMAOH (mole)/$CO_3$ (mole)=1.6, and an addition amount was represented as a mole number of $(TMA)_2CO_3$ per 1 kg of silica. FIG. 3 shows each level of the tests performed. Polishing conditions were the same as those in Example 2.

TABLE 3

Edge polishing test results

| Item | Example 16 | Example 17 | Example 18 | Example 19 | Example 20 |
|---|---|---|---|---|---|
| Kind of slurry | Production Example 1 | Production Example 1 | Production Example 1 | Production Example 1 | Production Example 1 |
| Silica concentration (wt %) | 1.0 | 1.0 | 2.0 | 2.0 | 3.0 |
| Kind of slurry | Production Example 4 | Production Example 4 | Production Example 4 | Production Example 4 | Production Example 4 |
| Silica concentration (wt %) | 1.0 | 1.0 | 2.0 | 2.0 | 3.0 |
| $(TMA)_2CO_3$ (mol/kg-SiO2) | 0.044 | 0.088 | 0.044 | 0.088 | 0.088 |
| pH. | 10.1 | 10.2 | 10.3 | 10.3 | 10.3 |
| Conductivity (per 1 wt % of silica particle) | 14.9 | 22.3 | 14.2 | 20.9 | 20.3 |
| Polishing test results | | | | | |
| Polishing rate (μm/min) | 5.1 | 5.7 | 6.6 | 7.3 | 7.9 |
| State of stain appearance on absorption surface | none | none | none | none | none |

Production Example 4

1,000 g of commercially available colloidal silica ("Silicadol 40L" manufactured by Nippon Chemical Industrial Co., Ltd., particle diameter of 21 nm, silica concentration of 40 wt %, Na content of 4,000 ppm) consisting of spherical silica particles was diluted to colloidal silica having a silica concentration of 20.1 wt % by addition of an equivalent amount of pure water. The diluted colloidal silica was dealkalized by passing it through a 1,200-ml column of a H-type strong acid cation exchange resin (AMBERLITE IR120B manufactured by ORGANO Corp.) that was preliminary regenerated with hydrochloric acid. In this way, 1,970 g of acidic colloidal silica having a pH of 2.8 and a silica concentration of 19.8 wt % were obtained.

25 wt % tetramethylammonium hydroxide was added to the acidic colloidal silica under stirring to prepare an alkaline colloidal silica having a pH of 10.1.

The present invention provides high-purity colloidal silica at low cost using a common alkali silicate solution as a material, which colloidal silica can be used for polishing on electronic materials such as silicone wafers, compound semiconductor wafers, semiconductor device wafers, magnetic disc substrates, and crystal substrates. The colloidal silica obtained by the production method of the present invention showed good wafer cleaning performance in flat surface polishing because the colloidal silica had a specific particle shape and contained an extremely small amount of metal impurities.

In addition, as polishing rate of the above colloidal silica in edge polishing is very fast compared with that of conventional polishing compositions, wafer cleaning performance was also improved. Use of the colloidal silica of the present invention contributes to prevention of wafer quality deterioration when electronic materials such as semiconductor wafers are subjected to surface polishing.

What is claimed is:

1. A polishing composition for a semiconductor wafer comprising tetraethylammonium hydroxide, colloidal silica prepared by mixing a colloidal silica consisting of non-spherical silica particles not forming second particles by aggregation, having a ratio of long axis to short axis of 1.5 to 15 as measured by transmission electron microscopic observation and having a mole ratio of silica to tetraethylammonium hydroxide of 10 to 120, and a colloidal silica consisting of spherical silica particles, wherein concentration of the non-aggregate non-spherical silica particles is 0.5 to 10 wt % with respect to total colloidal solution, and total concentration of the silica particles is 0.5 to 50 wt % with respect to total colloidal solution.

2. A polishing composition for a semiconductor wafer according to claim 1, where a pH is 8 to 11 at 25° C.

3. A polishing composition for a semiconductor wafer according to claim 2, having an alkali metal content of 50 ppm or less based on the silica.

4. A polishing composition for a semiconductor wafer according to claim 1, wherein the silica particles have an average short axis of 5 to 30 nm as measured by transmission electron microscopic observation, and silica concentration is 10 to 50 wt %.

5. A polishing composition for a semiconductor wafer according to claim 1, comprising a base and having a pH of 8 to 11 at 25° C.

6. A polishing composition for a semiconductor wafer according to claim 1, comprising a buffer solution which is a combination of a weak acid having a pKa that is a logarithm of a reciprocal of acid dissociation constant of 8.0 to 12.5 at 25° C. and a strong base, wherein the polishing composition has a buffering action at 25° C. in the range from pH 8 to pH 11.

7. A polishing composition for a semiconductor wafer according to claim 6, wherein an anion constituting the weak acid is a carbonate ion and/or a hydrogen carbonate ion, and a cation constituting the strong base is a chorine ion, a tetramethylammonium ion, a tetraethylammonium ion or a mixture thereof.

8. A polishing composition for a semiconductor wafer according to claim 1, wherein conductivity per 1% by weight of the silica particles at 25° C. is 20 mS/m or more.

9. A polishing method comprising:

rotating a rotatable polishing plate and/or a semiconductor wafer while the polishing composition according to claim 1 is supplied to the polishing plate to polish a surface of the semiconductor wafer by using the polishing plate having a polishing cloth fixed to both or either of its upper and lower face, under a state of pressing the semiconductor wafer against the polishing plate.

10. A polishing method comprising:

pressing a semiconductor wafer to an edge polishing machine having a polishing pad attached to a pad support, the polishing pad consisting of a synthetic resin foam, a synthetic leather or a non-woven cloth; and rotating the pad support and/or the semiconductor wafer while supplying the polishing composition according to claim 1 to polish an edge of the semiconductor wafer.

* * * * *